United States Patent [19]

Djennas et al.

[11] Patent Number: 5,474,958

[45] Date of Patent: Dec. 12, 1995

[54] METHOD FOR MAKING SEMICONDUCTOR DEVICE HAVING NO DIE SUPPORTING SURFACE

[75] Inventors: Frank Djennas, Austin; Victor K. Nomi, Round Rock; John R. Pastore, Leander; Twila J. Reeves, Austin; Les Postlethwait, Lexington, all of Tex.

[73] Assignee: Motorola, Inc., Schaumburg, Ill.

[21] Appl. No.: 55,863

[22] Filed: May 4, 1993

[51] Int. Cl.[6] .................................................. H01L 21/56
[52] U.S. Cl. .......................... 437/211; 437/209; 437/212; 437/215; 437/217; 437/220; 257/676; 257/787
[58] Field of Search ..................... 437/211, 212, 437/215, 217, 220, 209; 257/676, 787

[56] References Cited

U.S. PATENT DOCUMENTS

| | | | |
|---|---|---|---|
| 4,866,506 | 9/1989 | Nambu et al. | 357/72 |
| 4,881,885 | 11/1989 | Kovac et al. | 264/272.17 |
| 4,961,105 | 10/1990 | Yamamoto | 357/72 |
| 4,994,411 | 2/1991 | Naito et al. | 437/217 |
| 5,095,361 | 3/1992 | Iwata | 437/217 |
| 5,106,785 | 4/1992 | Rauchmaul et al. | 437/220 |
| 5,122,860 | 6/1992 | Kikuchi et al. | 357/72 |
| 5,142,450 | 8/1992 | Olson et al. | 361/421 |
| 5,147,821 | 9/1992 | McShane et al. | 437/212 |
| 5,166,099 | 11/1992 | Ueda et al. | 437/220 |
| 5,200,362 | 4/1993 | Lin et al. | 437/207 |
| 5,202,288 | 4/1993 | Doering et al. | 437/220 |
| 5,227,662 | 7/1993 | Ohno et al. | 257/676 |
| 5,289,033 | 2/1994 | Asami et al. | 257/676 |

FOREIGN PATENT DOCUMENTS

| | | | |
|---|---|---|---|
| 0134940 | 10/1980 | Japan | 264/272.17 |
| 3086440 | 4/1988 | Japan | 257/676 |
| 63-283136A | 11/1988 | Japan . | |
| 2119255 | 5/1990 | Japan | 257/676 |
| 3198356 | 8/1991 | Japan | 437/217 |
| 4034958 | 2/1992 | Japan | 257/787 |
| 5047835 | 2/1993 | Japan | 437/220 |
| 5047836 | 2/1993 | Japan | 437/220 |

*Primary Examiner*—Olik Chaudhuri
*Assistant Examiner*—Long Pham
*Attorney, Agent, or Firm*—Minh-Hien N. Clark

[57] ABSTRACT

A wire bondable plastic encapsulated semiconductor device (58) having no die supporting surface can be manufactured. In one embodiment, a semiconductor die (22) and a plurality of conductors (12) extending toward the periphery of the die are provided. The die is rigidly held in place on a workholder (60) with a vacuum (62) for the wire bonding process. Wire bonds (26) electrically connect the die to the conductors. The wire bonded die is then placed inside a mold cavity (64), and a resin encapsulated is transferred into the cavity under elevated temperature and pressure to form package body (70) around the die, the wire bonds and a portion of the conductors. Before the package body is formed, the die is supported solely by the the rigidity of the wire bonds since there is no die supporting surface connected to the conductors.

14 Claims, 9 Drawing Sheets

5,474,958

METHOD FOR MAKING SEMICONDUCTOR DEVICE HAVING NO DIE SUPPORTING SURFACE

CROSS-REFERENCE TO RELATED APPLICATION

Related subject matter is disclosed in U.S. patent application Ser. No. 08/024,124 now U.S. Pat. No. 5,291,062 by Leo M. Higgins, III entitled "Area Array Semiconductor Device Having a Lid with Functional Contacts," filed Mar. 1, 1993, in U.S. Patent application Ser. No. 08/012,193 now U.S. Pat. No. 5,378,981 by Leo M. Higgins, III, entitled "Method for Testing a Semiconductor Device on a Universal Test Circuit Substrate," filed Feb. 2, 1993, and U.S. Patent application Ser. No. 07/876,315 now U.S. Pat. No. 5,273,938 by Paul T Lin et al., entitled "Resin Encapsulated Multichip Semiconductor Device and Method for Its Fabrication" filed Apr. 30, 1992, and assigned to the assignee hereof.

1. Field of the Invention

This invention relates to a semiconductor device in general, and more specifically to a plastic encapsulated semiconductor device having no die supporting surface and a method for making the same.

2. Background of the Invention

Plastic encapsulated semiconductor devices are susceptible to moisture ingress due to the permeable nature of plastic molding compounds. Devices containing moisture levels exceeding some critical amount run the risk of cracking or "popcorning" during the rapid heating of the solder reflow operation associated with board mounting of devices. Typically, the cracks begin at an interface within the package. FIG. 1 illustrates, in a top view, a typical leadframe 10 of the prior art. The leadframe 10 has a plurality of leads 12, a die supporting surface 14, and a plurality of tie bars 16 which physically connect the die supporting surface 14 to the rest of the leadframe 10. The die supporting surface 14 is also known as a flag, a die pad, or a die paddle in the art. The leadframe 10 is the framework for assembling a semiconductor device 20, as illustrated in FIG. 2.

In FIG. 2 the semiconductor device 20 is illustrated in cross section so that the interfaces within the packaged device can be discussed. A semiconductor die 22 is mounted on die supporting surface 14 with a die attach adhesive 24. A plurality of wire bonds 26 electrically connect the semiconductor die 22 to the plurality of leads 12. The tie bars which physically connect the die supporting surface to the leadframe are not seen in this cross section. As illustrated in FIG. 2, the die supporting surface is downset below a plane as defined by the leads 12. This downsetting is typically done to aid in the symmetry of the plastic package body 28 in order to reduce stress within the packaged device. Plastic package body 28 is normally formed from transfer molding a resin encapsulant or mold compound, a process well known in the art.

When a semiconductor device, such as the one illustrated in FIG. 2, cracks during a solder reflow operation normally associated with board mounting, the crack typically initiates at one of the interfaces 30, 32, or 34. Interface 30 is an interface between the backside of die supporting surface 14 and the mold compound of package body 28. Adhesion between the leadframe metal and a mold compound is relatively weak as compared to adhesion between the silicon die 22 and the mold compound. A second interface 32, an interface between the die attach adhesive 24 and the die supporting surface 14, has also been observed to be a crack initiation site. Interface 34, an interface between the backside of the semiconductor die 22 and the die attach adhesive 24, is another potential crack initiation site within the packaged device. Typically, the weakest interface in the package will be the initiation site of a crack. The weakest interface delaminates, and the crack propagates through the plastic package body to the outer surface of the package body. On occasion, where the die attach adhesive 24 has a lot of voids (not illustrated), the package crack will initiate within the die attach adhesive itself at one of the voids. Mechanical failure of a semiconductor device often times lead to subsequent electrical failure of the same device due to thermal and mechanical stresses induced on the device during its operation.

FIG. 3 illustrates another semiconductor device 40 known in the prior art to have "popcorning" or cracking problems. In this type of device, semiconductor die 22 is mounted onto a substrate 42 that has a die supporting surface 44. Substrate 42 is typically a printed circuit board (PCB) material that has metallizations 46 and 48 on the top and bottom surfaces of the substrate. Metallizations 46 and 48 are typically connected to each other with plated vias (not illustrated). The interfaces 50 and 52 are the two interfaces that have been observed to be crack initiation and/or delamination sites. Again, it has been observed on occasion that cracking initiates within the die attach adhesive 24.

Another factor to be considered when utilizing a plastic encapsulated semiconductor device is its thickness. It is often desirable to minimize the thickness of a packaged semiconductor device since they are widely used in various types of electronic products, portable consumer products, telephones, pagers, automobiles, integrated circuit cards, and the like, in order to make the final products as thin as possible.

Thus, it is desirable to manufacture a plastic encapsulated semiconductor device which is resistant to package cracking during a solder reflow operation, in addition to obtaining a thin package profile in the encapsulated device.

SUMMARY OF THE INVENTION

This invention provides a semiconductor device having no die supporting substrate and a method for making the same. In one embodiment, a semiconductor die having an active surface and a periphery is provided. The semiconductor die is placed on a supporting workholder, where the die is rigidly held in place. A plurality of conductors extending toward the periphery of the semiconductor die is provided. The active surface of the semiconductor die is electrically connected to the plurality of conductors. A package body is formed from a resin encapsulant to cover at least the active surface of the semiconductor die and the electrical connections. A plurality of external conductors electrically connected to the semiconductor die is provided. The invention also provides a device produced by the same method. In the device, the semiconductor die is substantially centered within a die cavity, wherein the die cavity has no die supporting surface.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

3

BRIEF DESCRIPTION OF THE DRAWINGS

Many figures which illustrate various embodiments of the present invention incorporate many of the same or similar elements. Therefore, like reference numerals designate identical or corresponding parts throughout the figures.

DETAILED DESCRIPTION OF A PREFERRED EMBODIMENT

Figure 1:
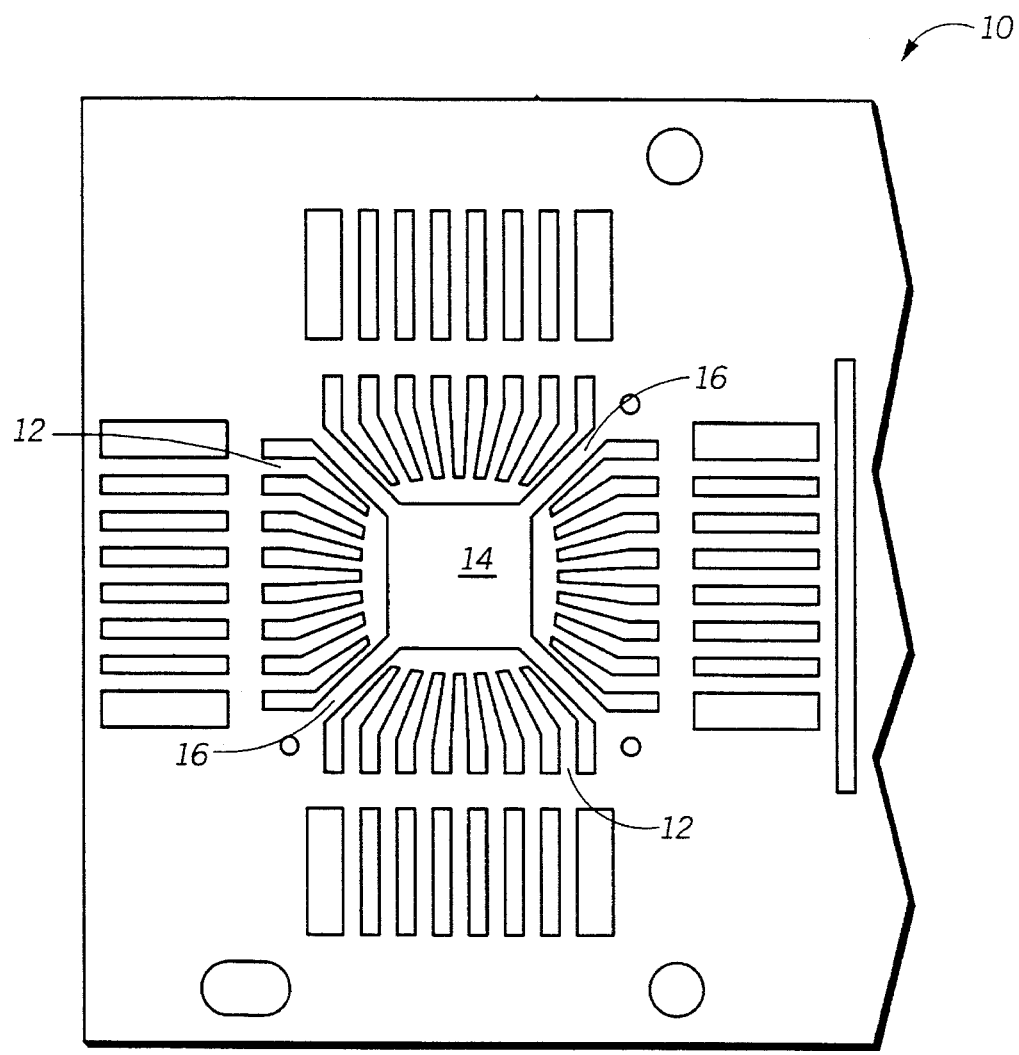
FIG. 1 illustrates, in a top view, a conventional leadframe of the prior art.
Figure 2:
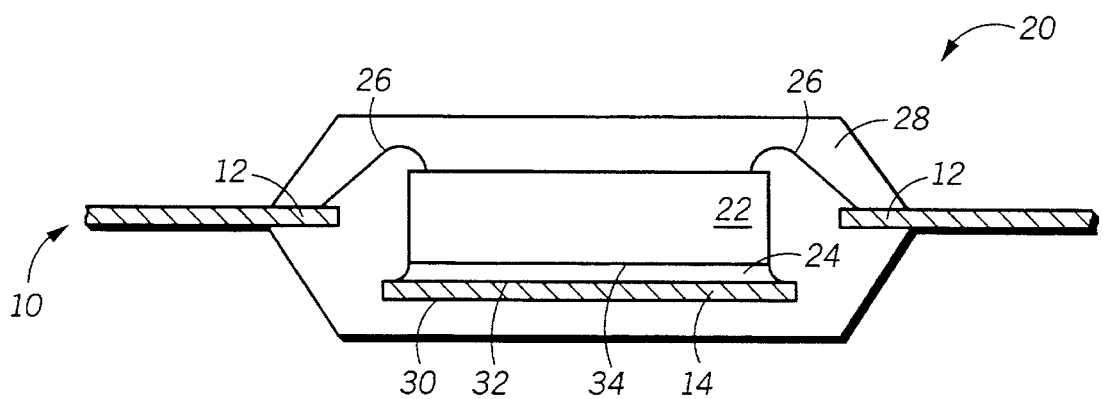
FIG. 2 illustrates, in cross-section, a plastic encapsulated semiconductor device of the prior art, having a conventional leadframe.
Figure 4:
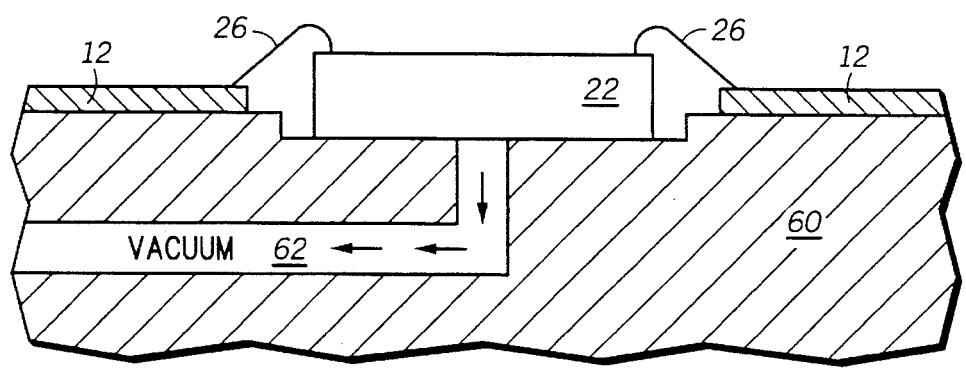
FIGS. 4–6 illustrate, in cross-section, process steps for manufacturing a wire bonded semiconductor device having no die supporting surface in accordance with a first embodiment of the invention.
Figure 5:
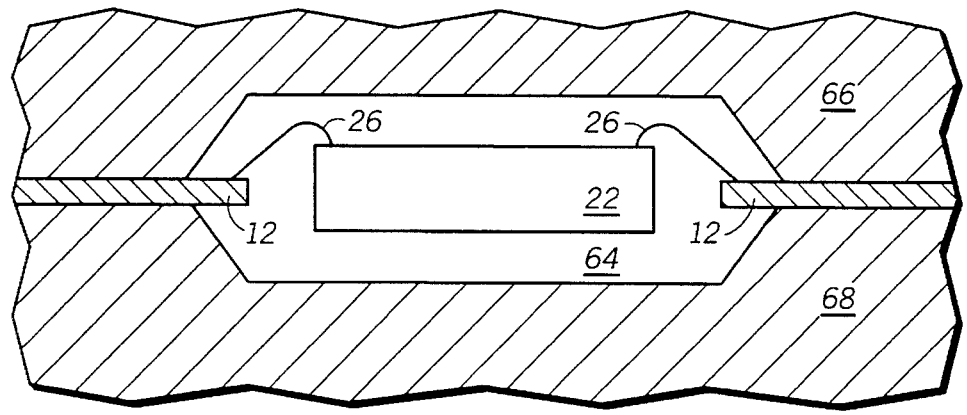
Figure 6:
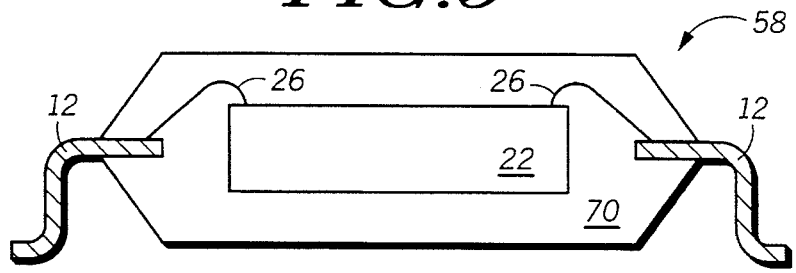

FIGS. 4–6 illustrate, in cross-section, process steps for manufacturing a wire bonded semiconductor device 58 (illustrated in FIG. 6) having no die supporting surface in accordance with a first embodiment of the invention. As illustrated in FIG. 4, semiconductor die 22 is placed directly on a supporting workholder 60. The plurality of leads or conductors 12 extend toward the periphery of the semiconductor die 22. Leads 12 effectively make a die cavity, wherein the semiconductor die 22 is disposed in a substantially centered position. The leads 12 comprise a portion of a leadframe, which is not fully illustrated because the outer portion of the leadframe is not relevant to the present invention. What is important to note is that the leadframe does not have a flag or die supporting surface, hence, no tie bars, such as shown in FIG. 1 of the prior art. Therefore, the semiconductor die is placed directly on the supporting workholder 60 for the wire bonding process. The workholder 60 has a vacuum line 62 that is activated to rigidly hold the semiconductor die 22 in place. Although FIG. 1 only illustrates a single vacuum line, any number of vacuum lines or holes can be used in the workholder to rigidly hold the die in place. The workholder is typically heated to a temperature in a range of 175° C. to 250° C. for wire bonding, preferably 200° C. to 230° C. The active surface of the semiconductor die 22 is wire bonded to the plurality of conductors 12. Gold or gold alloy wires are typically used for the wire bonds, although other conductive metals and metal alloys may also be utilized. Methods of wire bonding are well known in the art. It is also possible to use low loop wire bonding in place of conventional wire bonding to make the electrical connections. Usage of low loop wire bonding will allow a thinner package body to be molded in a subsequent process step. However, other methods of electrically connecting the die to the leads or conductors are also possible, such as tape automated bonding.

FIG. 5 illustrates, in cross-section, a next step in the process of making the wire bonded semiconductor device 58 of FIG. 6. As illustrated in FIG. 5, the semiconductor die 22 has been removed from the supporting workholder 60, illustrated in FIG. 4, so that the die 22 is supported solely by the plurality of wire bonds 26. The stiffness of the wire bonds 26 is sufficient to hold the semiconductor die 22 in place during handling, transport, and most importantly, the molding process. The die 22 and the plurality of conductors 12 making up the leadframe are placed inside a mold cavity 64 formed by two mold platens 66 and 68. A resin encapsulant is injected into the mold cavity 64, typically under elevated temperature and pressure, to form a package body around the die 22, the wire bonds 26, and a portion of the plurality of conductors 12. Conventional transfer molding equipment using existing mold designs can be used for this molding step. No modification of the molding equipment is necessary. Typical resin encapsulants that can be used for the package body include epoxy novolac resins and silicone resins. However, other materials may also be suitable for the package body such as phenolics, other thermosets, thermoplastics, and glob top materials. As illustrated in FIG. 5, the sidewalls of the mold cavity 64 are angled. Although not a requirement in practicing the invention, having tapered sidewalls aid in the release of a molded package body from the mold.

FIG. 6 illustrates, in cross-section, the completed wire bonded semiconductor device 58 in a first embodiment of the present invention. After the step of molding in FIG. 5, the plastic encapsulated device is removed from the mold. The semiconductor die 22, the plurality of wire bonds 26, and a portion of the plurality of leads or conductors 12 are encapsulated by the package body 70. Package body 70 corresponds substantially in size and shape to that of the mold cavity 64, illustrated in FIG. 5. The portion of the plurality of leads 12 which is external to the package body 70 is formed into a desired external lead configuration. In this illustration, the device 58 has a gull-wing lead configuration, but other external lead configurations may also be possible, such as J-lead or an in-line configuration. It should also be understood that other assembly process steps may follow after the step of molding prior to the step of lead forming. Those assembly process steps may include, but are not limited to, post mold curing, deflashing/dejunking, plating, marking, dam bar removing, and singulating. However, these steps are well known in the art.

The wire bonded plastic encapsulated semiconductor device 58 of FIG. 6 offers several advantages over the prior art. Since there is no die supporting surface, the three critical interfaces where package cracking normally initiates have been eliminated in this first embodiment of the invention. In addition to a more crack resistant package, substantial cost savings can be realized in materials, equipment, and cycle time. The die attach process has been eliminated, thus eliminating the need for a die attach adhesive, refrigerators for storing the die attach adhesive, die attach equipment, ovens for curing the die attach adhesive, and floor space to accommodate all the equipment associated with the die attach process. Moreover, the resulting package profile of the wire bonded device 58 is thinner than that of a conventional plastic encapsulated device because the thickness of the leadframe in the die cavity and the thickness of the die attach adhesive have been eliminated from the packaged device. In addition to a thinner profile, the wire bonded device of the present invention may also provide shorter wire bond lengths because the tie bars have been eliminated from the leadframe. Therefore, the space made available by the elimination of the tie bars can be used to route the leads or conductors closer to the periphery of the semiconductor die, thus enabling the shorter wire bond lengths.

Figure 7:
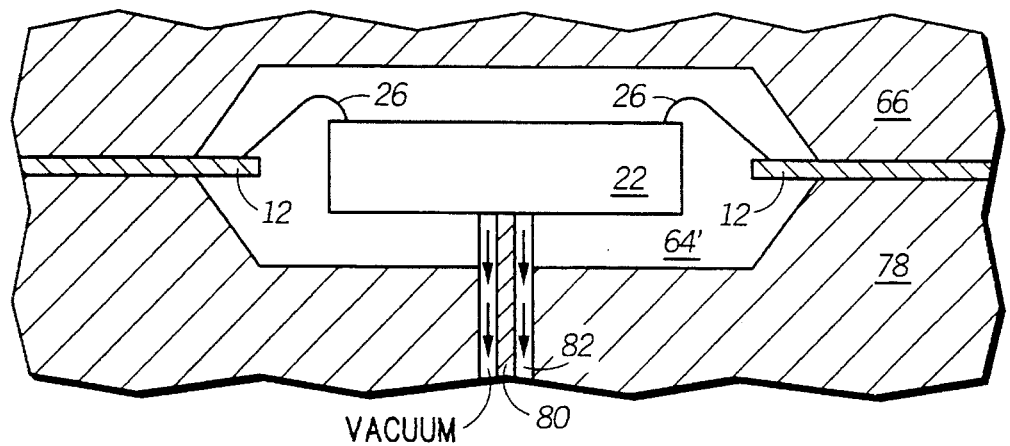
FIG. 7 illustrates, in cross-section, an alternative molding method in accordance with a second embodiment of the invention.
Figure 8:
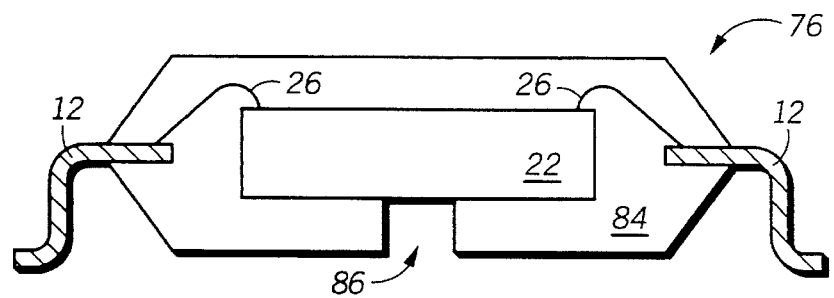
FIG. 8 illustrates, in cross-section, a wire bonded semiconductor device in the second embodiment of the invention.

FIG. 7 illustrates, in cross-section, an alternative method of molding a wire bonded semiconductor device 76 (illustrated in FIG. 8). In FIG. 7, the two mold platens 66 and 78 form the cavity 64' wherein the lower mold platen 78 has a support pin 80 and a vacuum line 82 which are used to support and stabilize the lower inactive surface of the semiconductor die 22 during molding. It should be understood that any number of support pins and vacuum lines may be used to support the die during the step of molding. It is envisioned that the semiconductor die may require the additional support provided by the support pin 80 if the semiconductor die were to exceed some critical die size, where the die may tilt during molding if not further supported. The support pin 80 provides stability in the z-direction, while the vacuum 82 provides stability in the x-y plane while additionally preventing a theta rotation of the die.

FIG. 8 illustrates the wire bonded semiconductor device 76 in a second embodiment of the invention. As illustrated in FIG. 8, the resultant package body 84 has a hole 86 in the lower half of the package body which exposes a portion of the inactive surface of the semiconductor die. This hole 86 can serve as a venting hole for the device. Alternatively, if the hole is made large enough, a drop-in heat sink (not illustrated) could be attached to the exposed portion of the inactive surface of the semiconductor die for added thermal dissipation. If a heat sink were to added, the device should be mountable in an inverted manner, thus, the external portion of the leads would be formed in the opposite direction. Additionally, if a number of support pins were used during molding, the package body would have the corresponding number of holes in the lower half of the package body.

Although not specifically illustrated in FIG. 7, it is also possible to support the inactive surface of the semiconductor die 22 with just a support pin, without the additional vacuum line. The support pin could be either retractable or nonretractable during the molding process. If the support pin is retracted during the molding process while the resin encapsulant is filling the mold cavity, then the resin encapsulant will flow into the area previously occupied by the support pin to fully encapsulate the semiconductor die. The resulting package body will look the same as that previously illustrated in FIG. 6. However, if the support pin is not retracted during the molding process, the resin encapsulant will flow around the support pin while filling the mold cavity. The pin would then be retracted after the package body has been formed. The resulting package body will have a vent hole the size of the support pin in the bottom of the package body. Vent holes have been employed in the past to provide a path for moisture to escape from the package body without causing the package body to crack.

Figure 9:
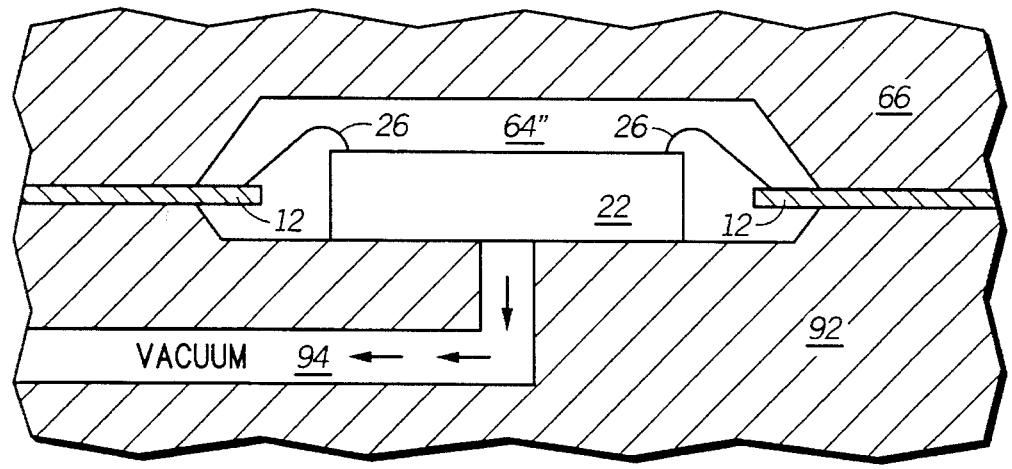
FIG. 9 illustrates, in cross-section, yet another alternative molding method in accordance with a third embodiment of the invention.

FIG. 9 illustrates, in cross-section, yet another alternative method of molding a semiconductor device 90 (illustrated in FIG. 10) in accordance with a third embodiment of the invention. In this method, the inactive surface of the wire bonded semiconductor die 22 is placed directly on a lower mold platen 92 to be supported by the surface of the mold platen. The mold platen 92 includes a vacuum line 94. When vacuum line 94 is activated, the semiconductor die 22 is held rigidly in place against the lower mold platen surface for the molding process. The activated vacuum line 94 also aids in the prevention of flash which may occur as a result of transferring the resin encapsulant into the mold cavity 64" under high pressure.

Figure 10:
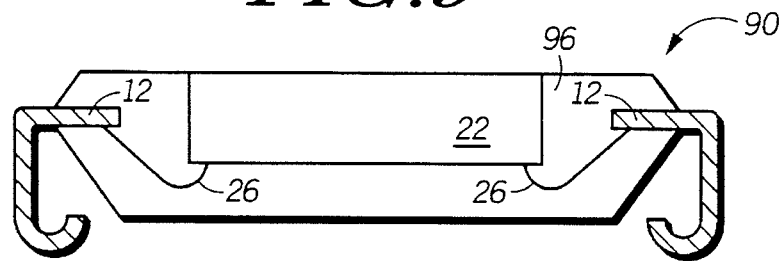
FIG. 10 illustrates, in cross-section, a wire bonded semiconductor device in the third embodiment of the invention.

FIG. 10 illustrates the wire bonded semiconductor device 90 produced by the method of FIG. 9. As illustrated, the package body 96 of device 90 exposes the inactive surface of the semiconductor die 22. The leads 12 have been formed externally into a J-lead configuration, where the die 22 has been inverted. Thus, after the device 90 is mounted to a board (not illustrated), the heat generated by the device 90 can be efficiently dissipated into the environment instead of being distributed through the board since silicon is a good conductor. Furthermore, a heat sink (not illustrated) can be attached to the exposed inactive surface of the die 22 for enhanced thermal dissipation. In addition to the aforementioned advantages of device 58, another advantage to device 90 is that the total thickness of the device has been decreased because the package body 96 is not a total encapsulation of the semiconductor die 22. It should be obvious that although device 90 is illustrated to be a J-leaded type of device, other external leads configurations are possible such as gull-wing and dual-in-line.

Figure 3:
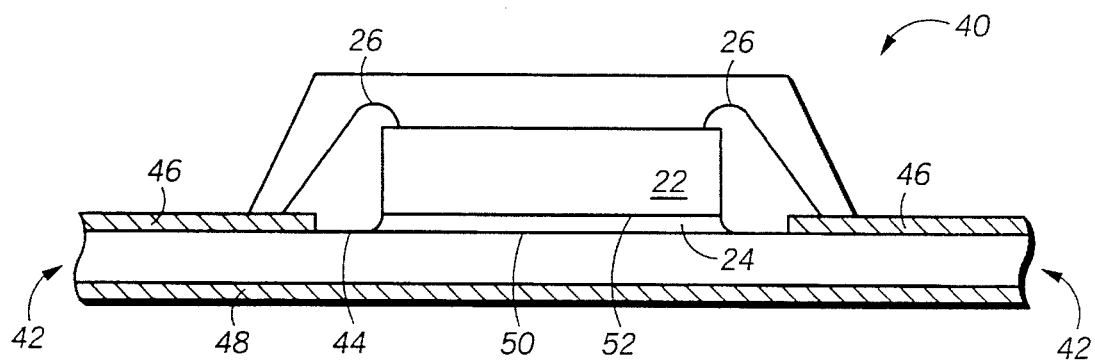
FIG. 3 illustrates, in cross-section, an overmolded semiconductor device of the prior art, having a conventional PCB substrate.
Figure 11:
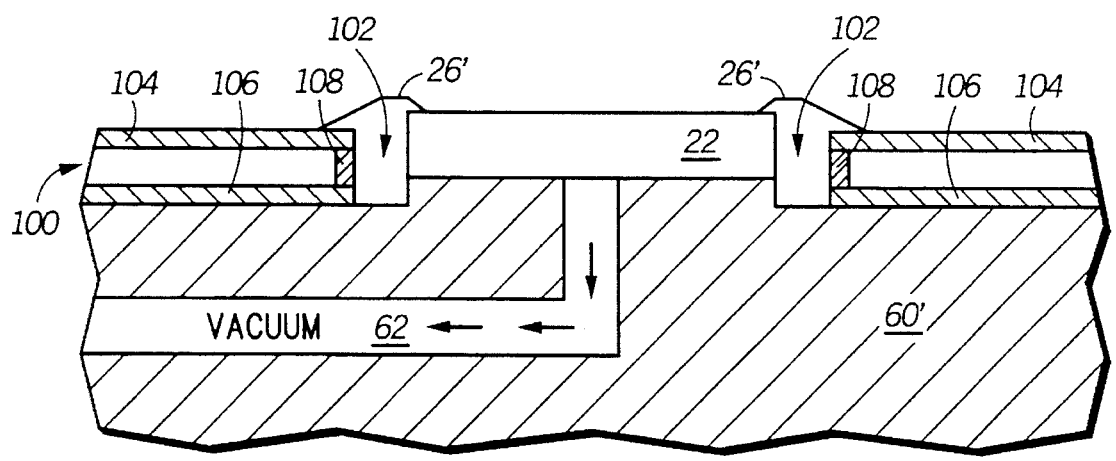
FIG. 11 illustrates, in cross-section, a wire bonding step for a wire bonded semiconductor device in accordance with a fourth embodiment of the invention.
Figure 14:
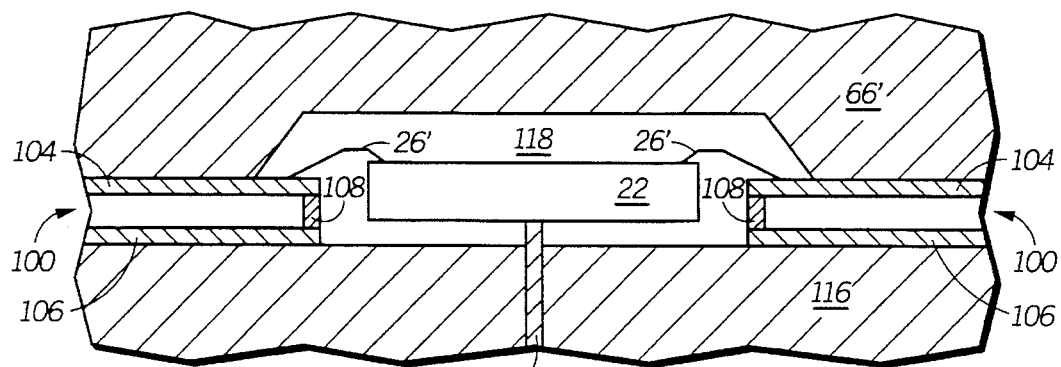
FIG. 14 illustrates, in cross-section, a molding step in accordance with the fourth embodiment of the invention.

FIGS. 11 and 14 illustrate, in cross-section, process steps for manufacturing a wire bonded semiconductor device having no die supporting surface in accordance with a fourth embodiment of the invention. As illustrated in FIG. 11, a substrate 100 having a die cavity 102 is provided. Substrate 100 is preferably, but not limited to, a PCB material such as bismaleimide triazine resin (BT resin). Other epoxy glass-reinforced cloth and other PCB materials are also suitable. In this embodiment, the area typically used for a die supporting surface in the substrate is removed to provide the die cavity 102. Semiconductor die 22 is disposed inside die cavity 102 and is placed directly on the supporting workholder 60 for the wire bonding process. The die 22 is substantially centered inside die cavity 102. The vacuum 62 rigidly holds the die 22 in place. FIG. 11 illustrates a plurality of low loop wire bonds 26' accomplished with a low loop wire bonder which is known in the art. However, conventional wire bonding may also be used in this embodiment. An advantage to having the die cavity 102 instead of a die supporting surface (such as illustrated in FIG. 3 of the prior art) is that a lower package profile can be obtained because two aforementioned interfaces found in the prior art have been eliminated.

Also illustrated in FIG. 11 are pluralities of conductive traces 104 and 106 and on the top and bottom surfaces of the PCB substrate 100, respectively. The two pluralities of conductive traces are electrically connected to each other by a plurality of plated vias (not illustrated in this view). As can be seen in FIG. 11, the die cavity has plated sidewalls 108, although the plating is not a requirement in practicing the present invention. However, it is advantageous to have plated sidewalls in the die cavity. The plated sidewalls 108 can be used as a power supply bus. All common power or ground traces can be tied to the plated sidewalls. Moreover, the plating also provides a smooth surface for the sidewalls, whereas an unplated sidewall may have a rough surface which could trap contaminants during the assembly process. Such contaminants would be encapsulated into the device during molding and could be detrimental to the device during its operation by causing corrosion.

Figure 12:
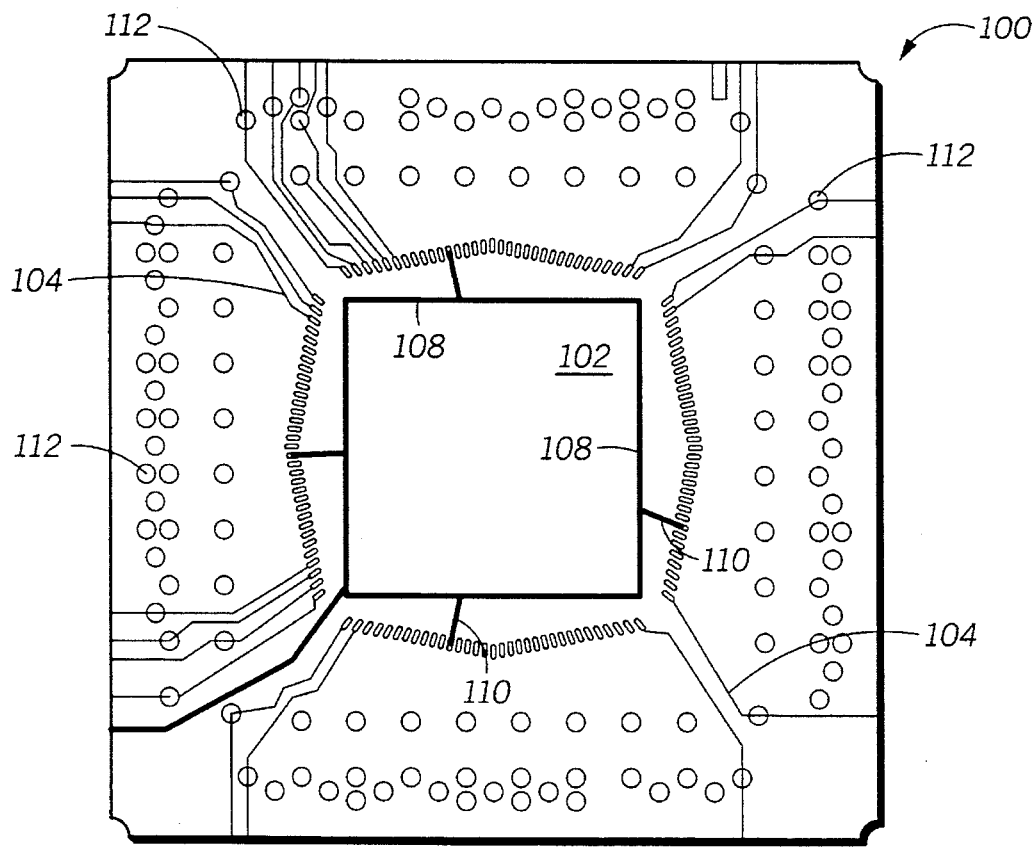
FIGS. 12–13 illustrate, in a top and bottom view, respectively, the PCB substrate of FIG. 11 showing a plated die cavity.
Figure 13:
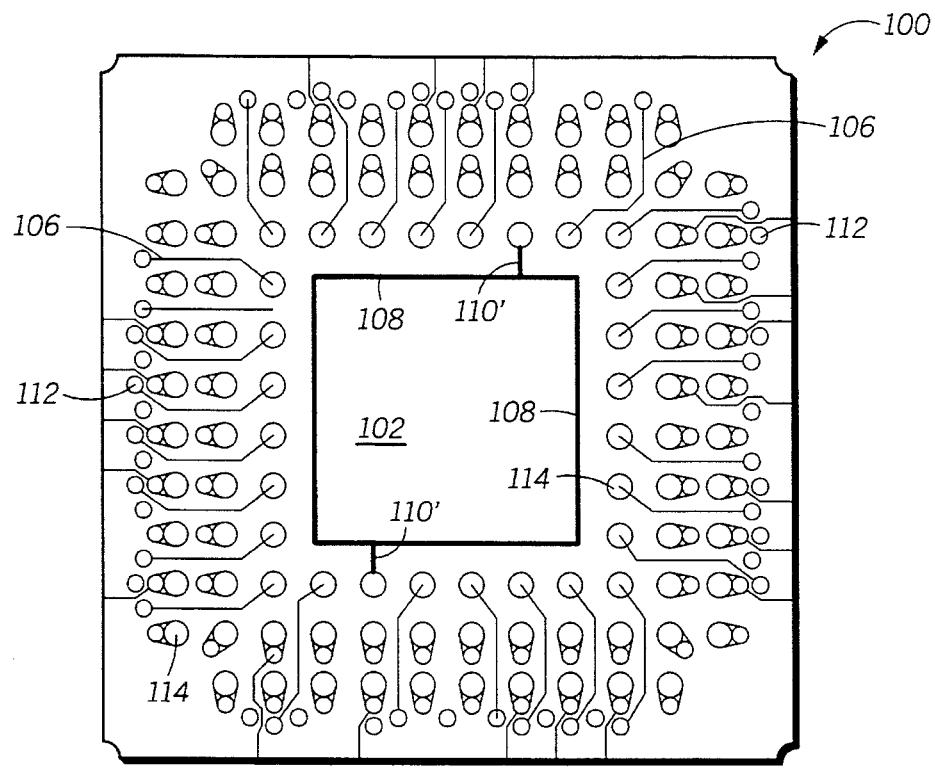

FIGS. 12 and 13 further illustrate, in a top and bottom view, respectively, the PCB substrate 100 of FIG. 11. As illustrated in FIG. 12, the plated sidewalls 108 of die cavity 102 are connected to representative power supply traces 110 of the plurality of conductive traces 104. It should be understood that the conductive traces depicted are only intended to be illustrative and that the actual pattern and location of specific traces depend on the semiconductor die to be packaged. Also illustrated in FIG. 12 is a plurality of vias 112, which are normally plated to electrically connect the traces 104 on the top surface of the substrate 100 to the conductive traces 106 on the bottom surface of the substrate. FIG. 13 illustrates a bottom view of the substrate 100. In addition to the plurality of vias 112, a plurality of solder pads 114 is also illustrated. Solder balls (not illustrated) are typically attached to the solder pads 114 to form external electrical contacts for the device. FIG. 13 also illustrates conductive traces 110' which electrically connect the plated sidewalls 108 of the die cavity 102 to power supply solder pads. It should be understood that the traces 110' are merely illustrative because the actual location and routing of these traces and corresponding solder pads depend on the device.

Illustrated in FIG. 14 is a molding step for the wire bonded semiconductor device in accordance with the fourth embodiment of the invention. After the semiconductor die 22 is wire bonded to appropriate conductive traces 104 on the PCB substrate 100, the substrate assembly is placed inside a mold having a top platen 66' and a bottom platen 116. The top and bottom mold platens define a mold cavity 118. A support pin 80 is used to support the inactive surface of the semiconductor die 22 during the step of molding. The pin 80 provides stability to the die 22 in the z-direction, which may be required while the resin encapsulant is filling the mold cavity if the die size is large. A small semiconductor die may not require the support pin because rigidity of the wire bonds 26' would be enough to hold the die in place during the filling of the mold cavity. Normally, the larger the die, the more likely it will tilt during molding if not supported. A very large die may require a plurality of support pins to provide stability to the die during the molding process.

Figure 15:
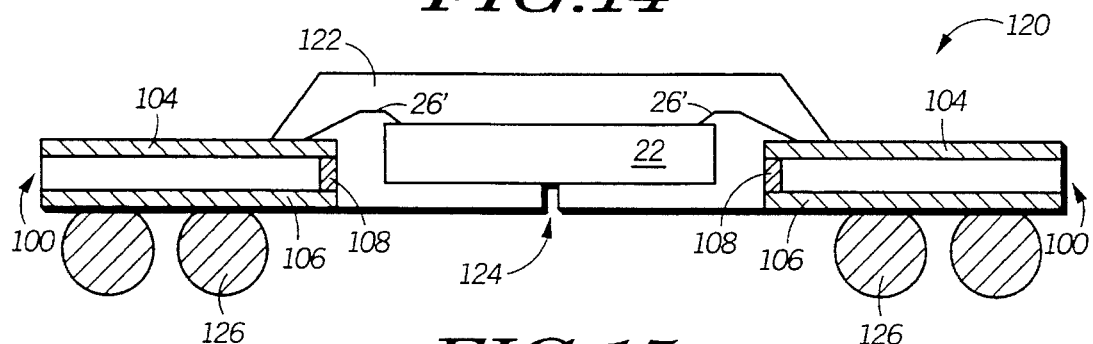
FIG. 15 illustrates, in cross-section, a wire bonded semiconductor device in the fourth embodiment of the invention.

FIG. 15 illustrates a molded wire bonded device 120 in the fourth embodiment of the invention. The device 120 has a package body 122 which substantially conforms to the size and shape of the mold cavity 118 of FIG. 14. A vent hole 124 for the release of moisture is present in the bottom of the package body 122 due to the support pin used during the molding process. A plurality of solder balls 126 provide external electrical connections for the device. The solder balls 126 are attached to the solder pads on the bottom surface of the substrate 100. The solder pads are illustrated in the bottom view of the substrate in FIG. 13. Device 120 shares the same low profile and crack resistant advantages of device 58 (FIG. 6) and device 76 (FIG. 8) because the interface between the die attach adhesive and the die supporting surface and the interface between the die supporting surface and the resin encapsulant have been eliminated.

Figure 16:
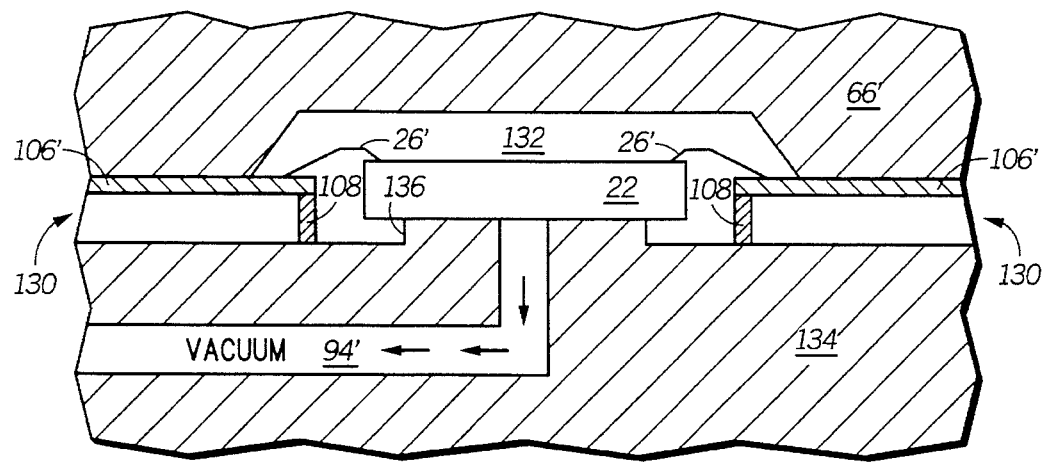
FIGS. 16–17 illustrate, in cross-section, process steps for manufacturing a wire bonded semiconductor device in accordance with a fifth embodiment of the invention.
Figure 17:
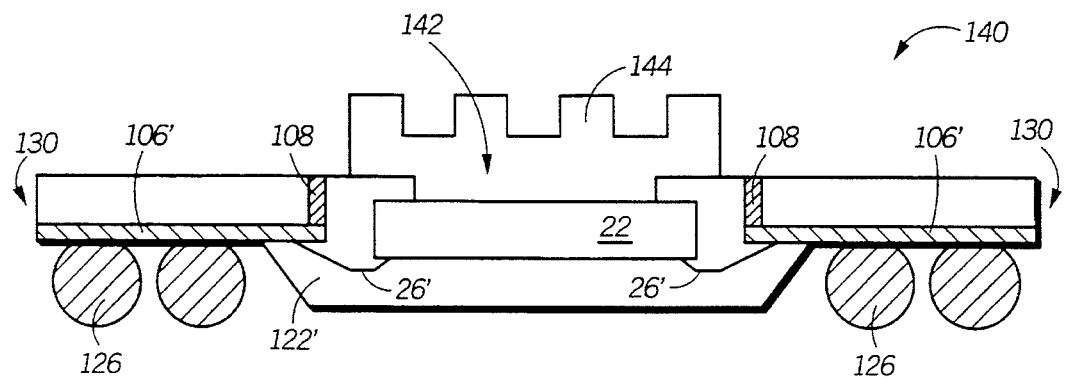

Illustrated in FIGS. 16–17 are process steps for manufacturing a wire bonded semiconductor device having no die supporting surface in accordance with a fifth embodiment of the invention. In FIG. 16, a semiconductor die 22 is wire bonded to conductive traces 106' on a surface of a substrate 130. Substrate 130 has conductive traces on one surface of the substrate. The conductive traces 106' terminate in a plurality of solder pads (not illustrated in this figure) in the same manner as previously illustrated in FIG. 13. Substrate 130 does not require conductive vias because there is no metallization on the opposing surface of the substrate to be connected to traces 106'. Accordingly, substrate 130 can be thinner than substrates requiring double sided metallization by the thickness of the metallization. However, if the routing pattern of the conductive traces 106' becomes complex or too dense, the other surface of the substrate may be used to support a second pattern of conductive traces which would be electrically connected to traces 106' with plated vias, much in the same manner as substrate 100 of FIG. 11. However, the solder pads of substrate 130 must be on the same side of the substrate as the conductive traces 106' which are wire bonded to the die. The semiconductor die 22 is wire bonded to the substrate 130 in substantially the same manner as that previously illustrated in FIG. 11. After the step of wire bonding, the substrate with the wire bonded die is placed inside a mold cavity 132 which is formed by two mold platens 66' and 134. The lower platen 134 has a pedestal 136 which directly contacts and supports the inactive surface of the semiconductor die 22. In conjunction with the pedestal is an activated vacuum line 94' which rigidly holds the die 22 to the pedestal 136 so that flashing does not occur during the molding process. A resin encapsulant is typically transferred into the mold cavity 132 under elevated temperature and pressure, with the pressure being in a range of 1000 psi to 2000 psi. With such a high pressure, flashing of the resin encapsulant can occur unless the clamping pressure on the mold platens is sufficient to prevent flash, or unless a vacuum is used to prevent flash from forming on the inactive surface of the die 22.

FIG. 17 illustrates a wire bonded semiconductor device 140 in the fifth embodiment of the invention. After the step of molding, the substrate 130 is inverted so that the conductive traces 106' are on the bottom. A plurality of solder balls 126 are then attached to the substrate. The solder balls are actually physically bonded to solder pads which are not shown in this illustration. However, the solder pads are substantially the same as that previously illustrated in FIG. 13. Conductive traces 106' terminate with the solder pads so that the plurality of solder balls 126 are electrically connected to the traces, hence, the semiconductor die. The package body 122' has an opening 142 which exposes a large portion of the inactive surface of the semiconductor die 22. A heat sink 144 can be optionally attached to this exposed portion of the inactive surface to increase the thermal dissipation capacity of the device during operation.

Figure 18:
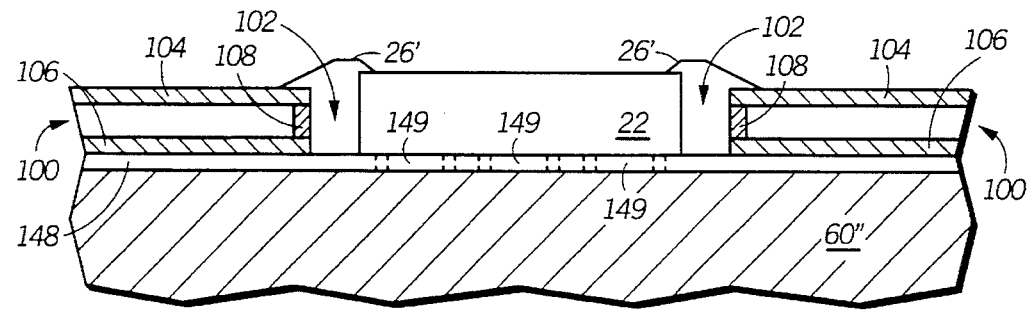
FIGS. 18–20 and 22 illustrate, in cross-section, process steps for manufacturing a wire bonded semiconductor device in accordance with a sixth embodiment of the invention.
Figure 20:
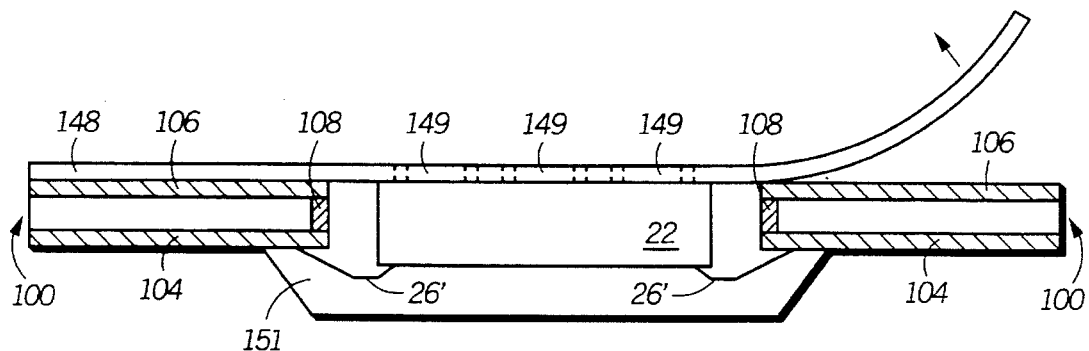
Figure 21:
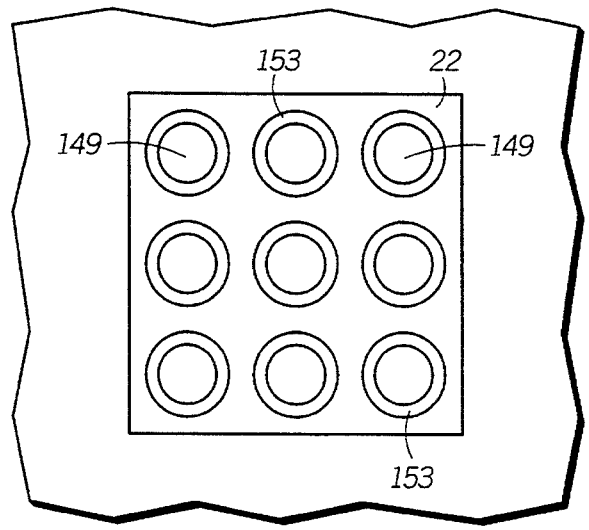
FIG. 21 illustrates, in a bottom view, annular rings of solder resist tape on the inactive surface of a semiconductor die in accordance with the sixth embodiment of the invention.
Figure 22:
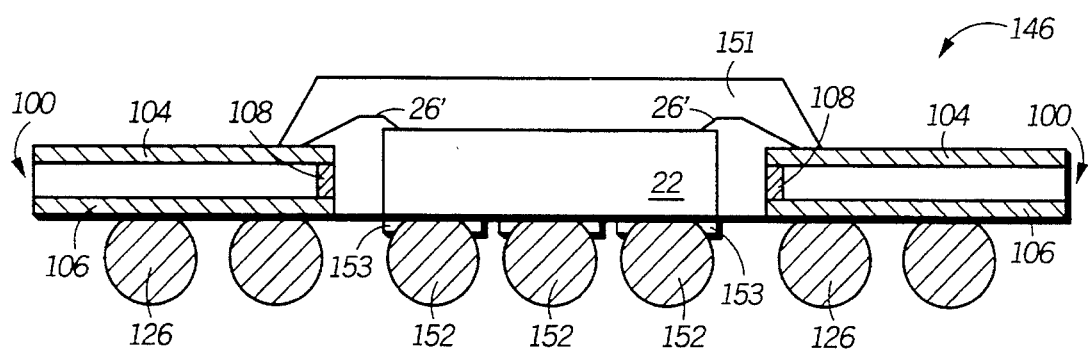

FIGS. 18–22 illustrate process steps for manufacturing a wire bonded semiconductor device in accordance with a sixth embodiment of the invention, where FIG. 22 illustrates the finished device 146. FIG. 18 illustrates, in cross-section, a wire bonding step for the device. A patterned removable tape 148 is affixed to the bottom surface of the substrate 100 including the die cavity 102. The tape can be applied by the manufacturer of the substrate in the normal fabrication steps of the substrate. The tape 148 provides a temporary die supporting surface whereupon the semiconductor die 22 is placed. The tape rigidly holds the die in place on top of the supporting workholder 60". The tape must be a solder resist material, such as a polyimide tape, a teflon tape, or a UV releasable tape. A UV releasable tape completely crosslinks upon exposure to UV light or radiation, thereby losing its adhesive quality thus enabling easy removal of the tape. Other high temperature tapes may also be used in practicing the invention. Tape 148 is perforated (illustrated by the dashed lines) underneath the inactive surface of the die 22. In addition, the tape 148 has a plurality of apertures 149 in the tape in the area underneath the semiconductor die. These apertures 149 allow solder balls (not illustrated) to be attached to the inactive surface of the silicon die without coalescing into a single solder mass. Most of the tape 148 will be removed in a subsequent step except the perforated portions underneath the die. Because the tape provides a temporary die supporting surface for the semiconductor die, no vacuum is necessary in the supporting workholder for the wire bonding process. Low loop wire bonds 26' electrically connect the semiconductor die to the conductive traces on the substrate. Alternatively, conventional loop height wire bonds may also be used. Methods of wire bonding are well known in the art.

Figure 19:
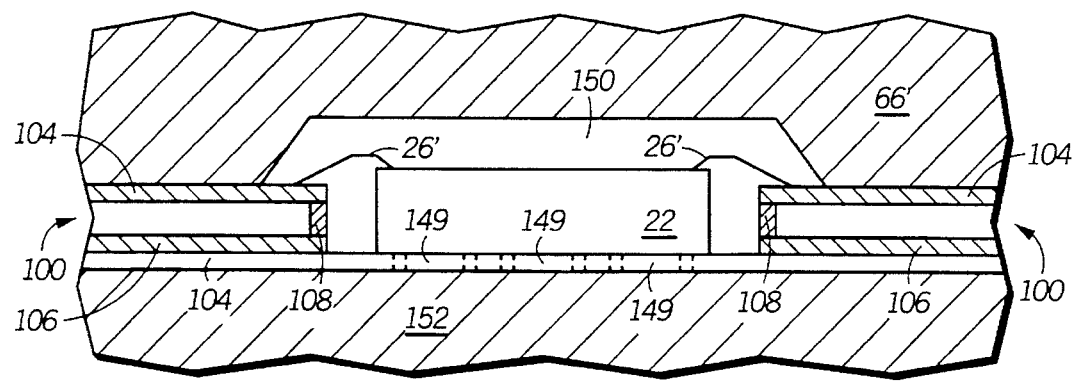

FIG. 19 illustrate, in cross-section, a molding step for the semiconductor device 146 of FIG. 22. The wire bonded structure of FIG. 18, composed of the die, the substrate, and the removable tape, is placed inside a mold cavity 150 formed by two mold platens 66' and 152. The lower mold platen 152 does not require a vacuum line because the tape 148 serves to prevent flash from forming on the inactive surface of the semiconductor die during the molding process. For this embodiment, a resin encapsulant is typically transferred into the mold cavity through a gate (not illustrated) in the top mold platen under elevated temperature and pressure. Suitable resin encapsulants can include, but are not limited to, epoxy novolac resin and silicone resin molding compounds.

FIG. 20 illustrates, in cross-section, the removal of the tape 148 from the bottom of the substrate 100 after the step of molding. Polyimide tape can be easily peeled from the surface of the substrate 100. UV releasable tape can also be easily removed once exposed to UV light or radiation. The perforations in the tape 148 in the die area effectively allows the tape to be peeled yet leaving portions of the tape remaining on the inactive surface of the die. FIG. 21 illustrates an annular ring configuration 153 for the remaining portions of the tape on the inactive surface of the die. An alternative option is to leave the entire inactive surface of the die covered with the patterned tape with only the apertures n the tape exposing solderable areas on the inactive surface. As illustrated in FIG. 20, the package body 151 does not cover the inactive surface of the semiconductor die 22. After the tape 148 is removed, the inactive surface is exposed except those portions covered by the annular rings 153 of tape.

Illustrated in FIG. 22 is a cross-sectional view of a wire bonded semiconductor device 146 in the sixth embodiment of the invention. As depicted, pluralities of solder balls 126 and 152 are attached to the bottom surface of the substrate and to the inactive surface of the semiconductor die, respectively. Solder balls 126 are attached to solder pads such as previously illustrated in FIG. 13. The solder balls 126 provide external electrical connections for the die 22. Solder balls 152 are directly attached to the inactive surface of the semiconductor die 22 inside the annular rings of tape remaining on the inactive surface. The annular rings of tape act as a solder mask so that the individual solder balls underneath the die do not coalesce into a single solder mass. The solder balls 152 provide a thermal path for the die so that heat can be dissipated into a PC board (not illustrated) directly from the semiconductor die 22. Additionally, the solder balls 152 have the same potential as the inactive surface of the die. Some devices are designed such that the inactive surface is used as a power supply (power or ground) plane. In such devices, the solder balls 152 could then provide either power or ground connections for the die. Furthermore, the plated sidewalls 108 of the die cavity 102 can be electrically connected to selective conductive traces to provide an opposite potential from the solder balls 152.

Figure 23:
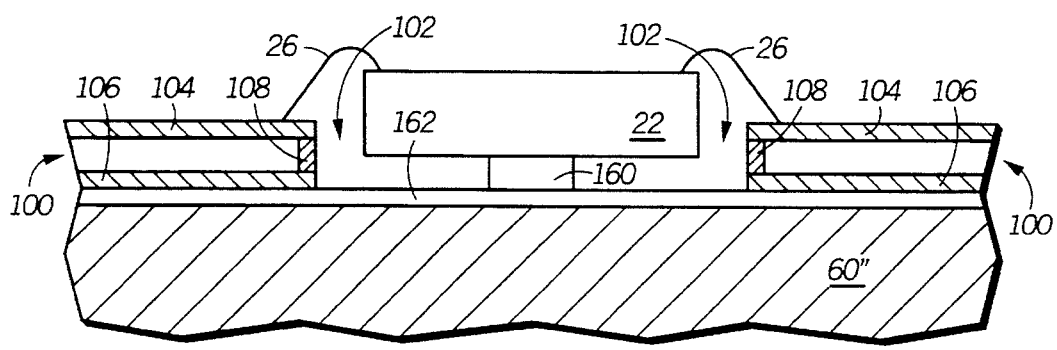
FIGS. 23–25 illustrate, in cross-section, process steps for manufacturing a wire bonded semiconductor device in accordance with a seventh embodiment of the invention.
Figure 24:
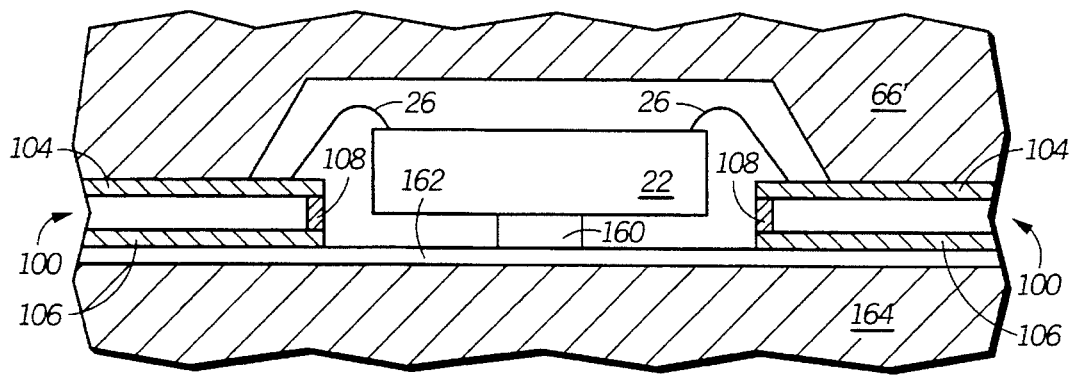
Figure 25:
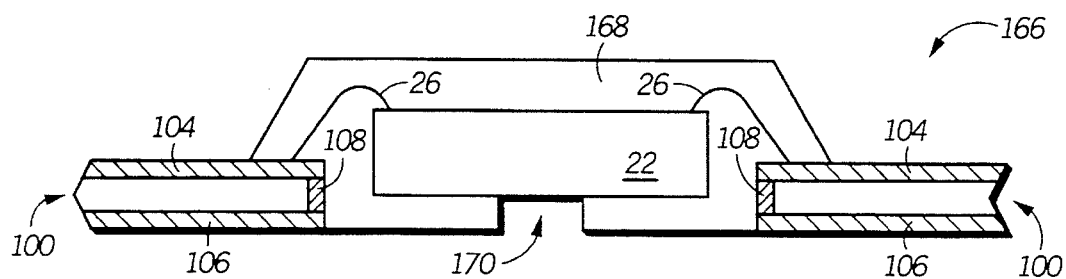

FIGS. 23–25 illustrate, in cross-section, process steps for manufacturing a wire bonded semiconductor device in accordance with a seventh embodiment of the invention. FIG. 23 illustrates semiconductor die 22 supported by a pedestal 160 which is mounted on a removable tape 162. Pedestal 160 has an adhesive on its top surface to rigidly hold the die 22 in place. Pedestal 160 can be made from a polyimide or a teflon, or another suitable high temperature material. The tape 162 has to cover at least the die cavity 102 in order to provide a temporary support for the semiconductor die 22 via the pedestal 160. Tape 162 is preferably a polyimide, but can also be teflon or another high temperature tape. Both the tape and the pedestal can be applied by the manufacturer of the substrate during the fabrication of the substrate. The die 22 is wire bonded to the substrate on the supporting workholder 60" using conventional or low loop wire bonding techniques. No vacuum is needed in the supporting workholder due to the presence of the tape.

After the step of wire bonding, the entire substrate assembly is placed inside a mold cavity 132' as illustrated in FIG. 24. The mold cavity 132' is formed by two platens 66' and 164. No vacuum is needed in lower mold platen 164 to prevent flash due to the presence of the tape. A resin encapsulant is typically transferred under elevated temperature and pressure through a gate (not illustrated) in the top mold platen for this configuration.

FIG. 25 illustrates, a molded wire bonded device 166 in the seventh embodiment of the invention. The tape 162 and pedestal 160 (illustrated in FIG. 24) have been removed from the molded device. Polyimide tape can easily be peeled from the substrate and silicon die surface. The resulting package body 168 has a hole 170 that exposes a portion of the inactive surface of the die 22 to provide a thermal and moisture path for the device. Solder balls (not shown) can be attached to solder pads (previously illustrated in FIG. 13) on the bottom surface of the substrate. Alternatively, if the device were to be mounted to a PC board in an inverted manner, the substrate should have solder pads on the same surface of the substrate as the package body. Then solder balls could be attached to the aforementioned solder pads, and the device can be inverted so that the exposed portion of the inactive surface of the die is seen from the top. In that manner, a drop-in heat sink can optionally be mounted to the exposed portion to increase the thermal dissipation capacity of the device.

Figure 26:
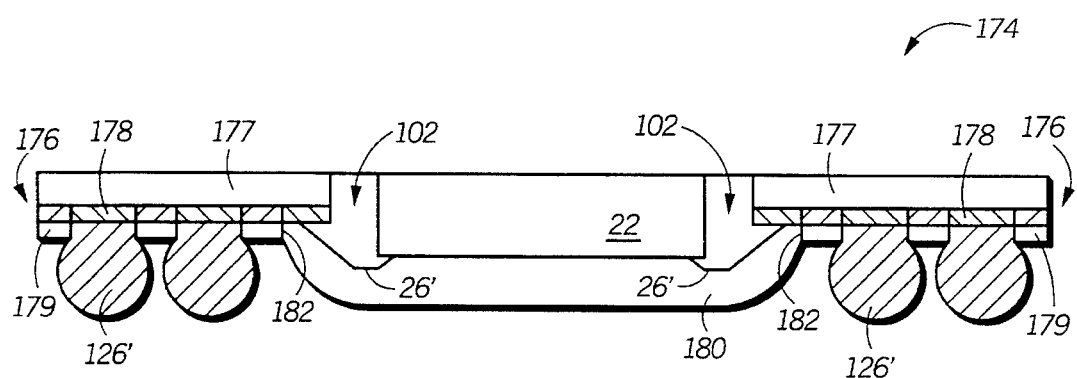
FIG. 26 illustrates, in cross-section, another wire bonded semiconductor device having a recessed substrate in an eight embodiment of the invention.

FIG. 26 illustrates, in cross-section, yet another wire bonded semiconductor device 174 in an eighth embodiment of the present invention. In this embodiment, the substrate 176 is multilayered having a first layer 177 of bulk material, a layer of conductive traces 178, and a second layer 179 of bulk material, wherein the second layer 179 has a plurality of recesses. The bulk material is composed of a PCB material, such as BT resin or an epoxy glass cloth. Conductive traces 178 are typically copper that has been plated with nickel and gold, or alloys thereof. Conductive traces 178 terminate in a plurality of solder pads (not illustrated in this figure) which corresponds in location to the recesses in the second layer 179 of bulk material. Thus, the solder pads are exposed. The semiconductor die 22 is electrically connected to the conductive traces with a plurality of low loop wire bonds 26'. Alternatively, conventional wire bonds may also be used. A package body 180 is formed to cover the active surface of the semiconductor die 22 and the plurality of wire bonds 26'. The package body 180 is illustrated as a glob top, but transfer molding of a resin encapsulant can also be used. The package body is constrained by natural dams 182 created by the second layer 179 of the bulk material of the substrate 176. A plurality of solder balls 126' are attached to the conductive traces 178 in the recesses. This embodiment of the invention provides a thinner profile device than a conventional planar substrate because the solder balls are recessed within the substrate. The thickness of this embodiment of the invention can be less than 1 mm, preferably 0.75 mm, while a typical thickness of the device in FIG. 3 of the prior art is greater than 2 mm.

Although FIG. 26 does not illustrate the die cavity 102 as having plated sidewalls, it is possible to plate the sidewalls to use as a power supply bus. Additionally, a heat sink may be added to the exposed inactive surface of the semiconductor die to increase the thermal dissipation capacity of the device.

The foregoing description and illustrations contained herein demonstrate many of the advantages associated with the present invention. In particular, a manufactureable process has been revealed to fabricate a wire bonded plastic encapsulated semiconductor device having no die supporting substrate. The semiconductor die is supported by the rigidity of the wire bonds instead of by a die supporting surface. Furthermore, the semiconductor device can be manufactured with an exposed inactive silicon surface for improved thermal dissipation in addition to the option of attaching a heat sink to the exposed surface. Embodiments of the invention do not have a die supporting surface, thus eliminating many of the weak package interfaces where cracking has been a problem. Additionally, since there is no die supporting surface, the die attach process and associated equipment and materials can be eliminated which translates into a faster assembly cycle time as well as a cost savings. The wire bonded semiconductor device of the present invention has a thinner profile than corresponding conventional plastic encapsulated devices.

Thus it is apparent that there has been provided, in accordance with the invention, a wire bonded plastic encapsulated semiconductor device and a method for its fabrication which overcomes the problems associated with the prior art devices. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the placement and geometry of the leads on the leadframe and of the conductive traces on the substrate are not restricted by the present invention. The routing of these conductors is dependent upon the types and configurations of the various semiconductor die used in a device. Furthermore, the external portion of the leads can be in any surface mount or through-hole configuration. In addition, the present invention is not limited to any specific number or kind of semiconductor die used. Any type of semiconductor die, such as a memory or a microprocessor, can be packaged in an embodiment of the invention. Furthermore, the package body may also have vertical sidewalls instead of tapered sidewalls. Additionally, a heat sink may be attached to the inactive surface of the semiconductor die in any of the embodiments provided that the inactive surface is at least partially exposed. Moreover, materials and methods other than those described for electrically connecting the semiconductor die to the leadframe and for molding the devices are possible, such as tape automated bonding and injection molding. Furthermore, the invention is not limited to silicon semiconductor devices but is also applicable to any other type of semiconductors such as gallium arsenide. Also, other methods of attaching the device to a board besides solder balls are anticipated as being suitable in practicing the invention, such as solder columns and conductive polymer balls. Thus it is intended to encompass within the invention all such variations and modifications falling within the scope of the appended claims.

What is claimed is:

1. A method for fabricating a semiconductor device comprising the steps of:

placing a semiconductor die having an active surface and a periphery on a supporting workholder;

attaching an inactive surface of the semiconductor die to a removable tape, the tape being supported by the workholder to rigidly hold the semiconductor die in a fixed position on the workholder;

providing a first plurality of conductors extending toward the periphery of the semiconductor die;

wire bonding the active surface of the semiconductor die to the first plurality of conductors;

forming a package body, having planar surfaces, to cover the active surface of the semiconductor die and a portion of the plurality of conductors; and providing a second plurality of conductors electrically connected to the semiconductor die to provide external electrical connections.

2. A method for fabricating a semiconductor device comprising the steps of:

placing a semiconductor die having an active surface and a periphery on a supporting workholder;

providing means for holding the semiconductor die rigidly on the supporting workholder for a subsequent electrical connecting step;

providing a first plurality of conductors extending toward the periphery of the semiconductor die;

electrically connecting the active surface of the semiconductor die to the first plurality of conductors;

supporting an inactive surface of the semiconductor die with a support pin in a mold;

molding a resin encapsulant inside a mold cavity having planar major surfaces to form a package body to cover the active surface of the semiconductor die and a portion of the plurality of conductors; and providing a second plurality of conductors electrically connected to the semiconductor die to provide external electrical connections.

3. The method of claim 2, wherein the step of supporting further comprises providing a vacuum line around the support pin.

4. A method for fabricating a semiconductor device comprising the steps of:

placing a semiconductor die having an active surface and a periphery on a supporting workholder;

providing means for holding the semiconductor die rigidly on the supporting workholder for a subsequent electrical connecting step;

providing a first plurality of conductors extending toward the periphery of the semiconductor die;

electrically connecting the active surface of the semiconductor die to the first plurality of conductors with connecting means, wherein said connecting means holds in place and physically supports the semiconductor die;

supporting an inactive surface of the semiconductor die with a surface of a mold platen which defines part of a mold cavity;

activating a vacuum line to rigidly hold the inactive surface against the mold platen surface; and transferring a resin encapsulant inside the mold cavity having planar major surfaces to form a package body to cover the active surface of the semiconductor die and a portion of the plurality of conductors; and providing a second plurality of conductors electrically connected to the semiconductor die to provide external electrical connections.

5. The method of claim 4, further comprising the step of:

attaching a heat sink to the inactive surface of the semiconductor die after the step of molding.

6. A method for fabricating a semiconductor device comprising the steps of:

placing a semiconductor die having an active surface and a periphery on a supporting workholder;

providing means for holding the semiconductor die rigidly on the supporting workholder for a subsequent electrical connecting step;

providing a first plurality of conductors extending toward the periphery of the semiconductor die;

electrically connecting the active surface of the semiconductor die to the first plurality of conductors;

supporting a portion of an inactive surface of the semiconductor die with a pedestal which extends into a mold cavity;

molding a resin encapsulant inside the mold cavity having planar major surfaces to form a package body to cover the active surface of the semiconductor die and a portion of the plurality of conductors; and providing a second plurality of conductors electrically connected to the semiconductor die to provide external electrical connections.

7. The method of claim 6, further comprising the step of:

attaching a heat sink to the portion of the inactive surface of the semiconductor die after the step of molding.

8. The method of claim 4, wherein the step of electrically connecting comprises a method selected from a group consisting of; wire bonding and low loop wire bonding.

9. The method of claim 4, further comprising the step of:

heating the supporting workholder to a temperature in a range of 175° C. to 250° C.

10. The method of claim 4, wherein the steps of providing the first and second pluralities of conductors comprise providing a flagless leadframe.

11. The method of claim 1, wherein the step of providing the first plurality of conductors comprises providing a PCB substrate having a die cavity and a plurality of conductive traces on a surface of the PCB substrate.

12. The method of claim 11, wherein the step of providing a PCB substrate comprises providing a PCB substrate having a die cavity having a plated sidewall, wherein the plated sidewall is connected to a power supply trace.

13. The method of claim 11, wherein the step of providing a PCB substrate comprises providing a PCB substrate having a plurality of recesses on a surface, the plurality of recesses corresponding in location to a plurality of solder pads which is electrically connected to the plurality of conductive traces.

14. A method for fabricating a semiconductor device comprising the steps of:

placing a semiconductor die having an active surface and a periphery on a supporting workholder;

providing means for holding the semiconductor die rigidly on the supporting workholder for a subsequent electrical connecting step;

providing a PCB substrate having a die cavity and a plurality of conductive traces on a surface of the PCB substrate, the plurality of conductive traces extending toward the periphery of the semiconductor die;

electrically connecting the active surface of the semiconductor die to the first plurality of conductors;

providing a removable tape that adheres to an inactive surface of the semiconductor die;

forming a package body to cover the active surface of the semiconductor die and a portion of the plurality of conductive traces;

removing a first portion of the tape from the inactive surface of the semiconductor die after the step of forming a package body, such that a second portion of the tape remains on the inactive surface forming a plurality of solder resist annular rings on the inactive surface;

attaching a first plurality of solder balls to the inactive surface of the semiconductor die inside the plurality of solder resist annular rings; and attaching a second plurality of solder balls to the plurality of solder pads inside the plurality of recesses in the multilayer PCB substrate.

\* \* \* \* \*